United States Patent
Catuogno

(10) Patent No.: US 8,555,230 B2
(45) Date of Patent: Oct. 8, 2013

(54) ISOLATION METHOD AND PACKAGE USING A HIGH ISOLATION DIFFERENTIAL BALL GRID ARRAY (BGA) PATTERN

(75) Inventor: Louis Catuogno, Redondo Beach, CA (US)

(73) Assignee: The Boeing Company, Chicago, IL (US)

(*) Notice: Subject to any disclaimer, the term of this patent is extended or adjusted under 35 U.S.C. 154(b) by 1036 days.

(21) Appl. No.: 12/234,516

(22) Filed: Sep. 19, 2008

(65) Prior Publication Data

US 2010/0077363 A1    Mar. 25, 2010

(51) Int. Cl.
*G06F 17/50* (2006.01)

(52) U.S. Cl.
USPC ............ 716/126; 716/129; 716/130; 716/137

(58) Field of Classification Search
USPC .......... 716/110, 118–119, 126, 129–130, 137
See application file for complete search history.

(56) References Cited

U.S. PATENT DOCUMENTS

| | | | |
|---|---|---|---|
| 6,346,743 B1* | 2/2002 | Figueroa et al. | 257/723 |
| 7,095,107 B2* | 8/2006 | Ramakrishnan et al. | 257/691 |
| 7,118,391 B2* | 10/2006 | Minich et al. | 439/79 |
| 7,146,550 B2* | 12/2006 | Nagata | 714/726 |
| 7,390,218 B2* | 6/2008 | Smith et al. | 439/607.1 |
| 7,620,922 B1* | 11/2009 | Wadland et al. | 716/132 |
| 7,949,974 B1* | 5/2011 | Moore et al. | 716/111 |
| 2002/0180468 A1* | 12/2002 | Aspir et al. | 324/753 |
| 2005/0196987 A1* | 9/2005 | Shuey et al. | 439/108 |
| 2005/0287850 A1* | 12/2005 | Minich et al. | 439/108 |
| 2006/0118929 A1* | 6/2006 | Ramakrishnan et al. | 257/678 |
| 2006/0152911 A1* | 7/2006 | Humbert et al. | 361/782 |
| 2006/0166398 A1* | 7/2006 | Chan | 438/106 |
| 2008/0214029 A1* | 9/2008 | Lemke et al. | 439/108 |
| 2009/0057920 A1* | 3/2009 | Dedic et al. | 257/778 |

OTHER PUBLICATIONS

BGA Crosstalk, Xilinx Virtex -4 FPGA and Altera Stratix II FPGA, Dr Howard Johnson, 2005 Signal Consulting Inc.

High Speed Differential Interconnection Design for Flip-Chip BGA Packages, W.L. Yuan, et al, Packaging Analysis and Design Center Singapore; 1-4244-0655-X/06, 2006IEEE.

Package-Design Techniques Help High-Speed Devices Reach Full Potential, Louis Shixi Liu Phd Asat Inc; May 11, 2000; WWW. Ednmag.Com.

* cited by examiner

*Primary Examiner* — Stacy Whitmore
(74) *Attorney, Agent, or Firm* — Caven & Aghevli LLC

(57) ABSTRACT

According to an embodiment an improved Application Specific Integrated Circuit (ASIC) isolation method and system for assigning signal pins in an ASIC package having a plurality of signal pins is disclosed. The method and system comprise identifying an isolation requirement of the ASIC and determining an optimized pattern for substantially diagonal pairing of signal pins in relation to the isolation requirement. The method includes pairing signal pairs substantially diagonally in accordance with the pattern.

17 Claims, 7 Drawing Sheets

100

300

400

ISOLATION METHOD AND PACKAGE USING A HIGH ISOLATION DIFFERENTIAL BALL GRID ARRAY (BGA) PATTERN

FIELD OF THE INVENTION

The present embodiment relates generally to Application Specific Integrated Circuits (ASICs), and more particularly, to improved isolation in ASIC configuration and design.

BACKGROUND

In today's market, demands for increased device speeds are ever-increasing and these demands are further challenging package substrate designs to enable improved chip performance. Today's telecommunications and consumer electronics continue to press towards miniaturization, low power consumption, and high integration, with higher transfer data rates. Package design in particular is more complex given the demand for high-speed devices and many of the traditional techniques are unable to provide for the needed performance. For instance, newer designs are demanding higher speeds and greater numbers of signals per application-specific integrated circuit (ASIC) package.

With the demand for high-speed differential signals, traditional approaches continue to be unable to satisfactorily provide for needed data rates, in part as these traditional approaches fail to provide for adequate isolation between the differential signals in packages, such as within a Ball Grid Array (BGA) package for example. Traditional approaches have unsuccessfully attempted to overcome these challenges by providing for vertical or horizontal offset pin assignments implementations which sacrifice density by assigning ground pins between signal pins thereby lowering the total number of signal pins. For instance, in FIG. 1, a traditional vertical pin assignment implementation (100) is set forth in which a 40 dB of isolation is realized which utilizes only 50% of pins as being assigned to signals (e.g., 110) and 50% of pins as being assigned to ground/power (e.g., 120). From FIG. 1, a differential signal pair is shown where two signal pins are connected at 130. Further, in FIG. 2, a traditional vertical pin assignment implementation (200) is set forth in which a 60 dB of isolation is realized which utilizes only 33% of pins as being assigned to signals (e.g., 210) and 67% of pins as being assigned to ground/power (e.g., 220). From FIG. 2, a differential signal pair is shown where two signal pins are connected at 230.

Therefore, traditionally, to improve the isolation, the approach often required is that additional pin spacing and/or placement of additional ground pins as between signal pins occurred to further attempt to improve isolation and reduce the effects of possible crosstalk. Unfortunately, the availability and density of active signals pins thereby decreased as a result. As a result, as will be appreciated by those skilled in the art, these traditional approaches fail to optimize the number of usable signal pins for a given amount of needed isolation in an ASIC footprint, die, or die package size. As a result, improving isolation while optimizing signal pin densities without impacting ASIC footprint size, presents challenges which traditional approaches fail to overcome.

Therefore, what is needed is an optimized approach for assigning signal pins in an optimized pattern for an ASIC arrangement to improve isolation without increasing ASIC footprint requirements.

SUMMARY

The present embodiment addresses such a need as it comprises an improved Application Specific Integrated Circuit (ASIC) isolation method for assigning signal pins in an ASIC package having a plurality of signal pins. The method comprises identifying an isolation requirement of the ASIC and determining an optimized pattern for substantially diagonal pairing of signal pins in relation to the isolation requirement. The method includes pairing signal pairs substantially diagonally in accordance with the pattern.

In another embodiment, a method of determining an optimized Application Specific Integrated Circuit (ASIC) signal pin layout having improved isolation comprises identifying an isolation requirement of the ASIC and determining an acceptable area for the ASIC. The method further includes substantially diagonally pairing one or more signal pins in relation to the isolation requirement and one or more of: adding proximately perpendicular signal pins to substantially diagonally-paired signal pairs wherein proximately perpendicular signal pins are along a first diagonal line perpendicularly extending from the substantially diagonally-paired signal pair, moving signal pins not residing along the first diagonal line away from the respective substantially diagonally-paired signal pins; and adding isolation spacing or ground pins proximate to respective substantially diagonally-paired signal pairs.

In another embodiment, an apparatus is disclosed comprising an Application Specific Integrated Circuit (ASIC) having a plurality of signal pins configured to be arranged such that one or more signal pins are substantially diagonally paired, wherein at least one substantially diagonally paired signal pin pair is determined as being a paired candidate by: identifying an isolation requirement of the ASIC; determining an acceptable area for the ASIC; and determining a candidacy of substantially diagonally pairing one or more signal pins in relation to the isolation requirement.

In various embodiments, the present invention provides for an optimized signal utilization in a determined pattern for a given isolation requirement. It will be appreciated by those skilled in the art that in the various embodiments herein set forth near perfect isolation may be obtained by the method by assigning adjacent pins using substantially diagonal pairing of differential signals in accordance with the method. The features, functions, and advantages can be achieved independently in various embodiments of the present invention or may be combined in yet other embodiments.

DETAILED DESCRIPTION

The following description is presented to enable one of ordinary skill in the art to make and use the embodiment and is provided in the context of a patent application and its requirements. Various modifications to the implementations and the generic principles and features described herein will be readily apparent to those skilled in the art. Thus, the present embodiment is not intended to be limited to the implementations shown, but is to be accorded the widest scope consistent with the principles and features described herein.

In various embodiments, the present invention provides a method for arranging signal pins for pairing in an Application Specific Integrated Circuit (ASIC) having a plurality of available signal pins, in which near perfect isolation may be obtained by using adjacent pins and substantially diagonal pairing of differential signals, in accordance with the various embodiments herein. While traditionally, the positioning of adjacent pins was attempted to provide isolation effects such that distant pins provided little if any impact on isolation, using the present invention, isolation performance may be improved by appropriately positioning pins away from paired signal pins, contrary to the traditional approach.

Figure 7:
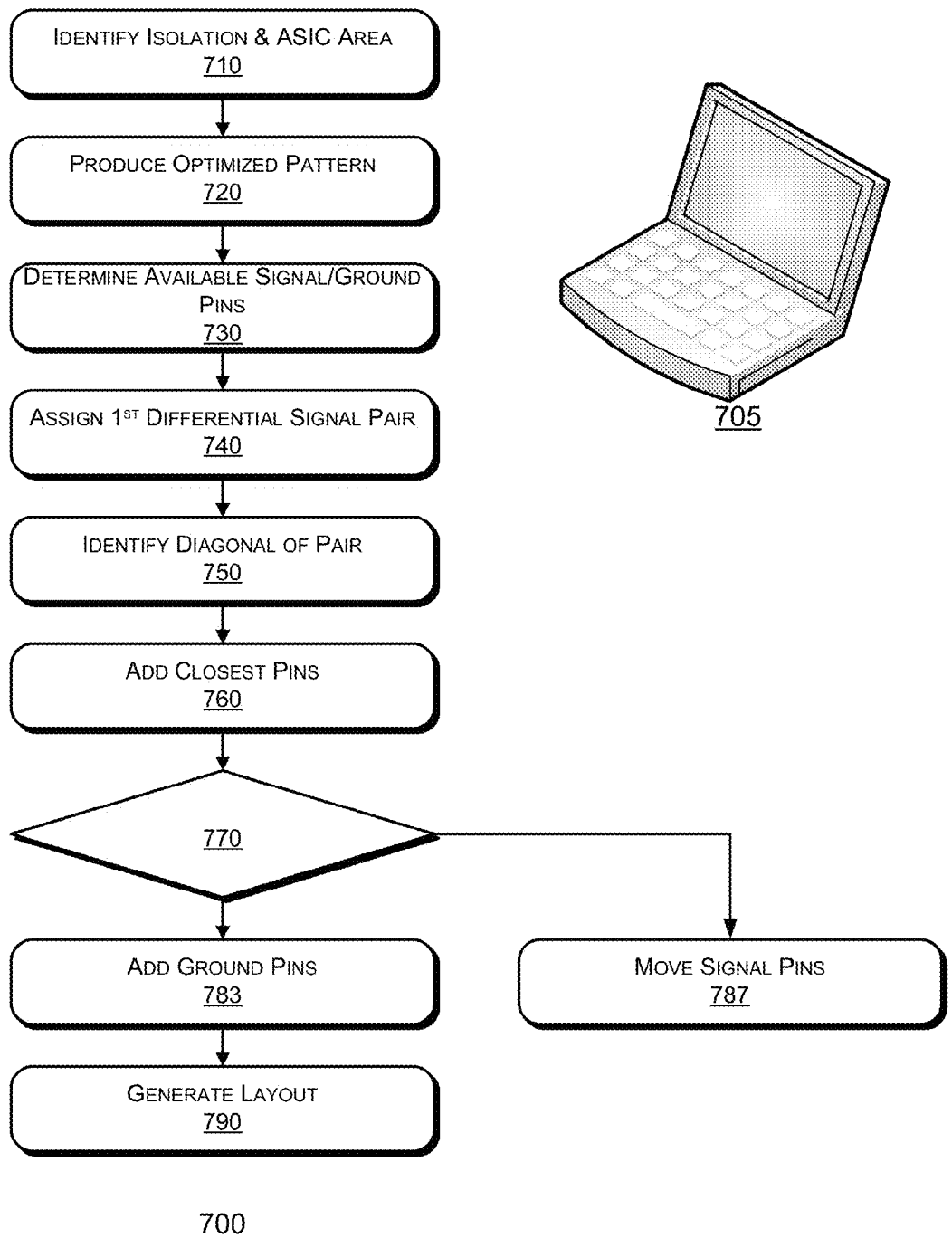
FIG. 7 sets forth a method of one or more various embodiments herein, in which an optimized pattern is generated.

FIG. 7 sets forth a method (700) of one or more various embodiments herein, in which an optimized pattern is generated. From FIG. 7, an isolation requirement and ASIC area is determined at 710. The present invention is not limited to a specific area and isolation requirement. Once determination of the ASIC area and isolation requirement occurs, an optimized pattern of substantially diagonal pairing of available signals pins may be determined at 720. Preferably, the determination of an optimized pattern is performed in relation to the isolation requirement and the ASIC area determined at 710, and, in other situations, also in relation to identified available ASIC signal pins and ground pins at 730 (however, such is not required). Preferably at 740, two adjacent signal pins may be identified and the two identified signal pins may then be assigned as a first diagonally-adjacent signal pin pair. Preferably at 750, a diagonal line perpendicular to the paired pins of 740 may be identified by a first diagonal line which extends perpendicularly from substantially diagonal of the paired pins of 740. The first diagonal line may be used as a reference line in a step of the method. Preferably at 760, the closest signal pins which reside on the first diagonal line may then be added to the paired pin for near perfect isolation. Cross-pairing may result depending on the configuration such that signal pins located proximate to paired signal pins along the first diagonal line perpendicular to a first determined signal pair have at least near perfect isolation.

Signal pins which may be proximate to the paired pins but which may not be added at 760 may then be handled at 770. Preferably at 770, depending on the specifics of the design, signal pins identified in relation to the first paired pins but which do not reside on the first diagonal line of 750 may then be moved at 787 to be farther away from the paired pins, to improve the isolation of the optimized pattern. Alternatively, or additionally, depending on the design, at 770, ground (i.e., or power) pins may be added at 783 to be proximate to the paired pins or may be placed in place of moved signal pins at 787. Once the moved pins become finally positioned, the optimized pattern is complete and may be generated at 790. Sample patterns using the various embodiments of the present invention are set forth in referenced figures. It will be appreciated by those skilled in the art that the method description of the various embodiments set forth above, does not require nor is limited by the sequences or preferential aspects set forth.

Figure 1:
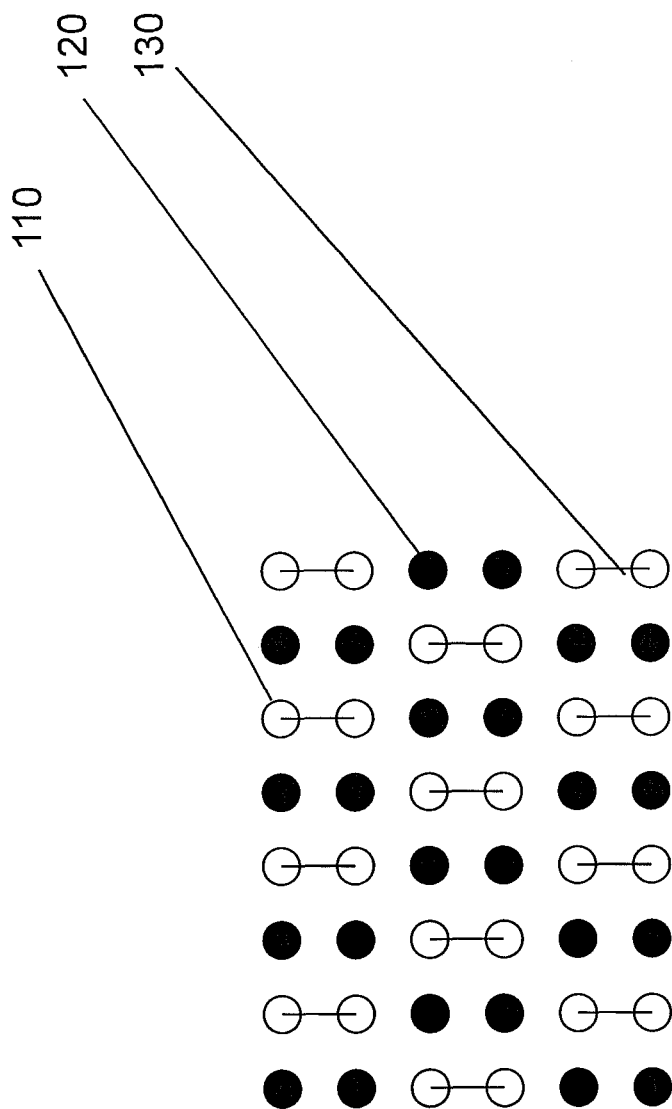
FIG. 1 sets forth a traditional pin assignment implementation in which a 40 dB of isolation is realized which utilizes only 50% of pins.

The implementations of the various embodiments herein provide for improved isolation over traditional approaches. Comparatively, referring again to FIG. 1, a traditional vertical pin assignment implementation (100) is set forth in which a 40 dB of isolation is realized which utilizes only 50% of pins as being assigned to signals (e.g., 110) and 50% of pins as being assigned to ground/power (e.g., 120). From FIG. 1, traditional approaches were unable to provide for improved isolation as the adjacent pins of the traditional approach typically provided for the lowest amount of isolation. Contradistinctively, in the various embodiments set forth herein, certain of the pins proximate to the signal pins, as determined to be paired by the embodiments herein, provide for the greatest amount of isolation, without requiring additional spacing or grounding pin, or adversely impacting an ASIC footprint.

Figure 3:
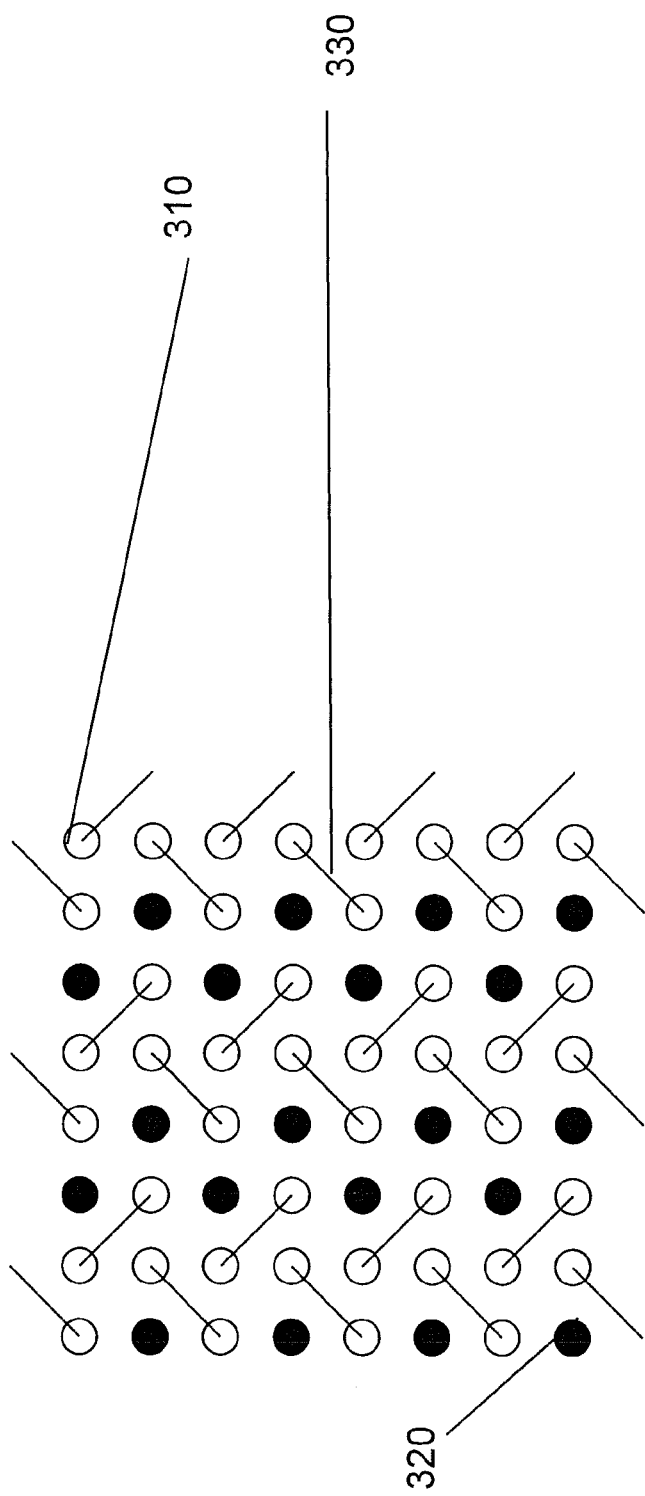
FIG. 3 sets forth an optimized pattern using the various embodiments herein, in which a 40 dB of isolation is realized using 67% of all of the pins of the Application Specific Integrated Circuit (ASIC).

In FIG. 3, using various embodiments herein, a 40 dB of isolation utilizing 67% of all of the pins is provided for. In FIG. 3, a substantially diagonal pin assignment of signal pins (300) is set forth from an optimized pattern determined by various embodiments herein in which signal pins (e.g., 310) may be paired and ground/power pins (e.g., 220) may be arranged in accordance with the optimized pattern. From FIG. 3, a differential signal pair is shown where two signal pins may be connected in accordance with the determined optimized pattern at 230. Comparatively, from FIG. 1, the traditional approach required more pins on the ASIC footprint in which only 50% were available for pairing to produce the equivalent isolation. Therefore, using the various embodiments herein, the effective increase in the number of usable pins is realized to be 17%.

Figure 4:
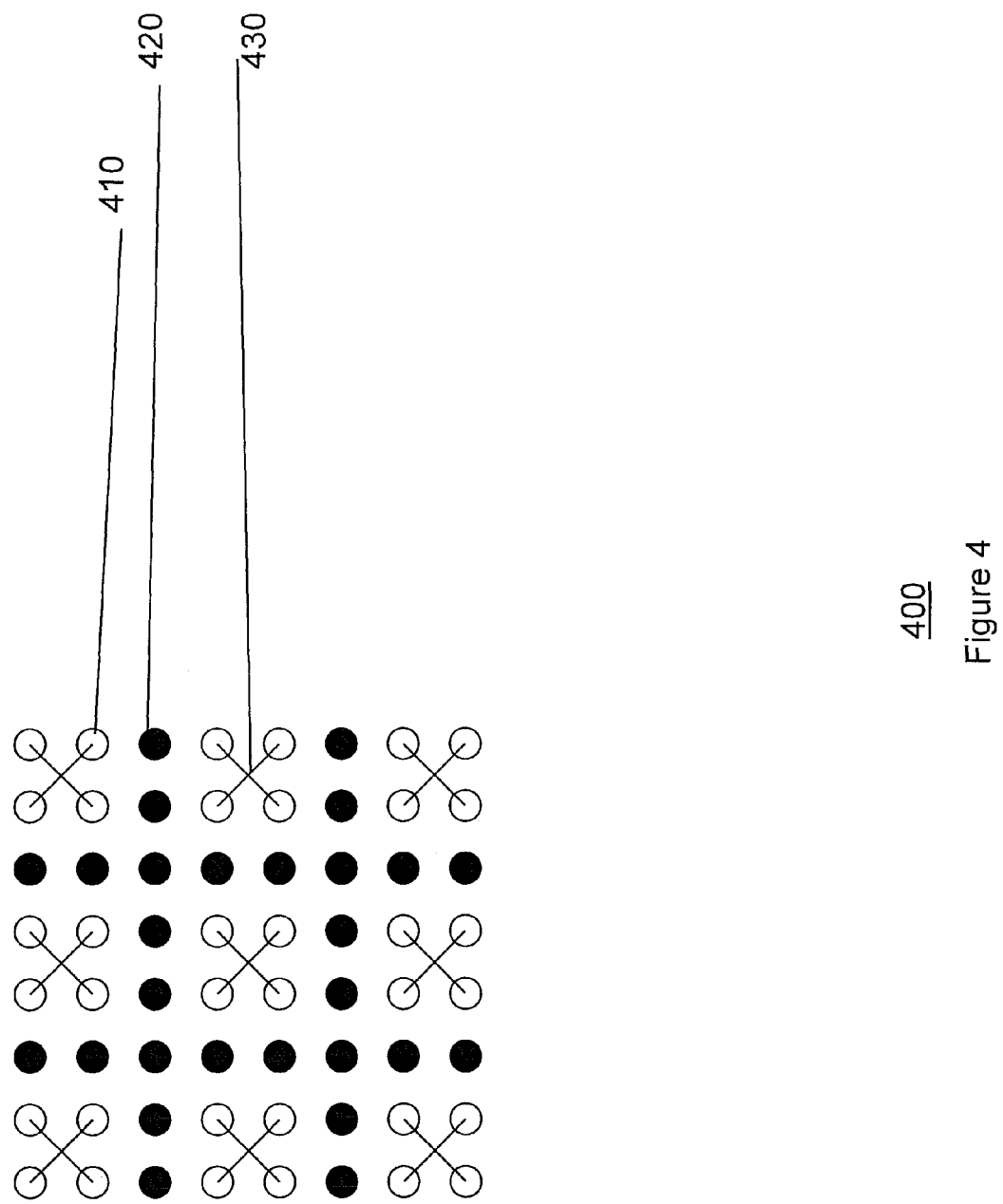
FIG. 4 sets forth an optimized pattern using the various embodiments herein, in which a 60 dB of isolation is realized using 44% of all of the pins of the ASIC.

In FIG. 4, using various embodiments herein, a 60 dB of isolation utilizing 44% of all of the pins is provided for. In FIG. 4, a substantially diagonal pin assignment of signal pins (400) is set forth from an optimized pattern determined by various embodiments herein in which signal pins (e.g., 410) may be paired and ground/power pins (e.g., 420) may be arranged in accordance with the optimized pattern. From FIG. 4, signal pins may be cross-paired as it has been determined from the various embodiments herein that signal pins located proximate to paired signal pins along an imaginary line perpendicular to a first determined signal pair have at least near perfect isolation.

Figure 2:
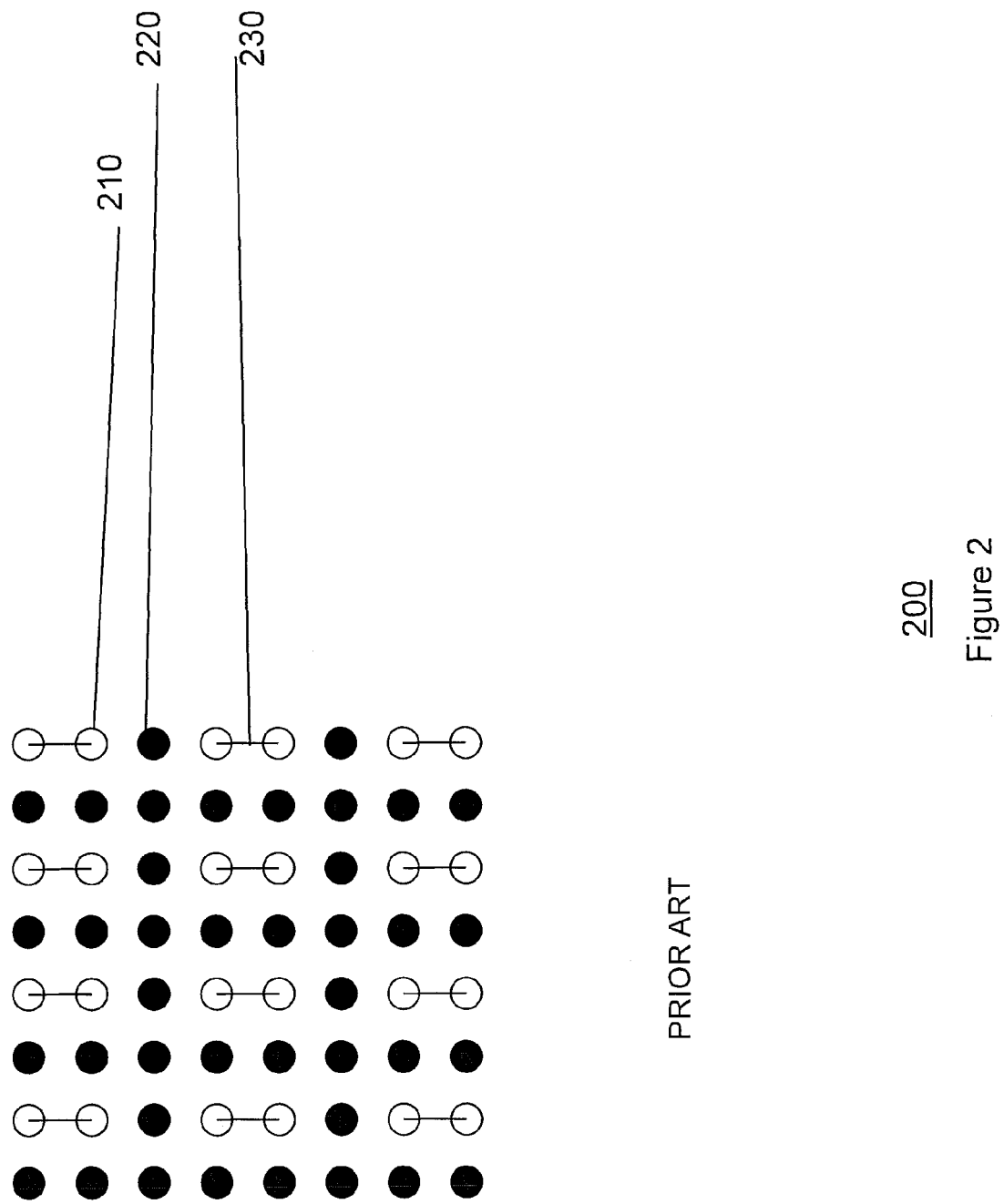
FIG. 2 sets forth a traditional pin assignment implementation in which a 60 dB of isolation is realized which utilizes only 33% of pins.

Further, from FIG. 4, a differential signal pair is shown where two signal pins may be connected in accordance with the determined optimized pattern at 330. Comparatively, from FIG. 1, the traditional approach required more pins on the ASIC footprint in which only 50% were available for pairing to produce an isolation that is only 67% as efficient. Comparatively, from FIG. 2, the traditional approach producing the same isolation utilized only 33% of pins as being assigned to signals (e.g., 210) and 67% of pins as being assigned to ground/power (e.g., 220). Therefore, using the various embodiments herein, it will be appreciated by those skilled in the art that various embodiments herein provide for an effective increase in the number of usable pins as well as improved isolation without impact to ASIC footprint requirements.

Figure 5:
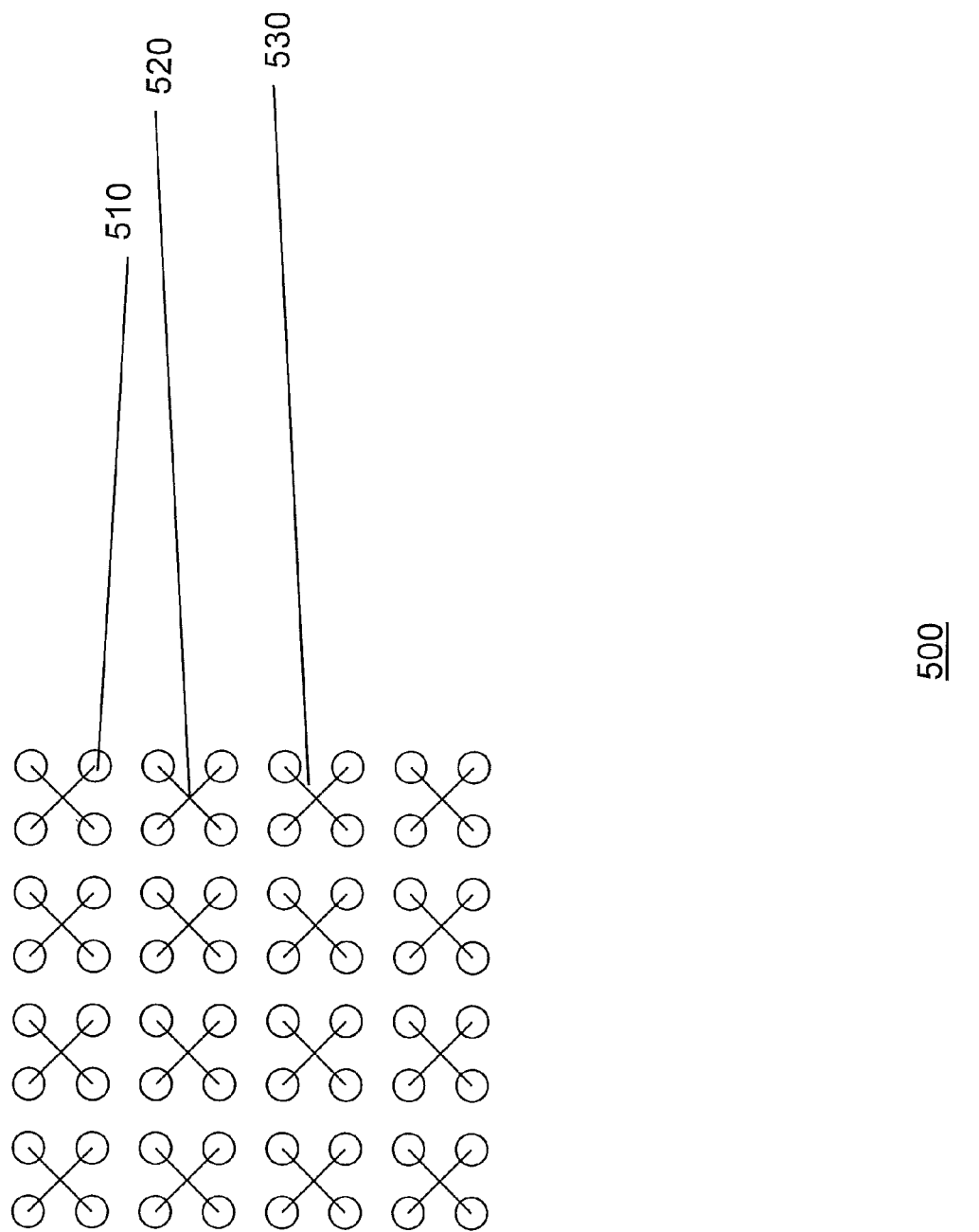
FIG. 5 sets forth an optimized pattern using the various embodiments herein, in which a 32 dB of isolation is realized for a 100% substantially diagonally-paired signal pin configuration.
Figure 6:
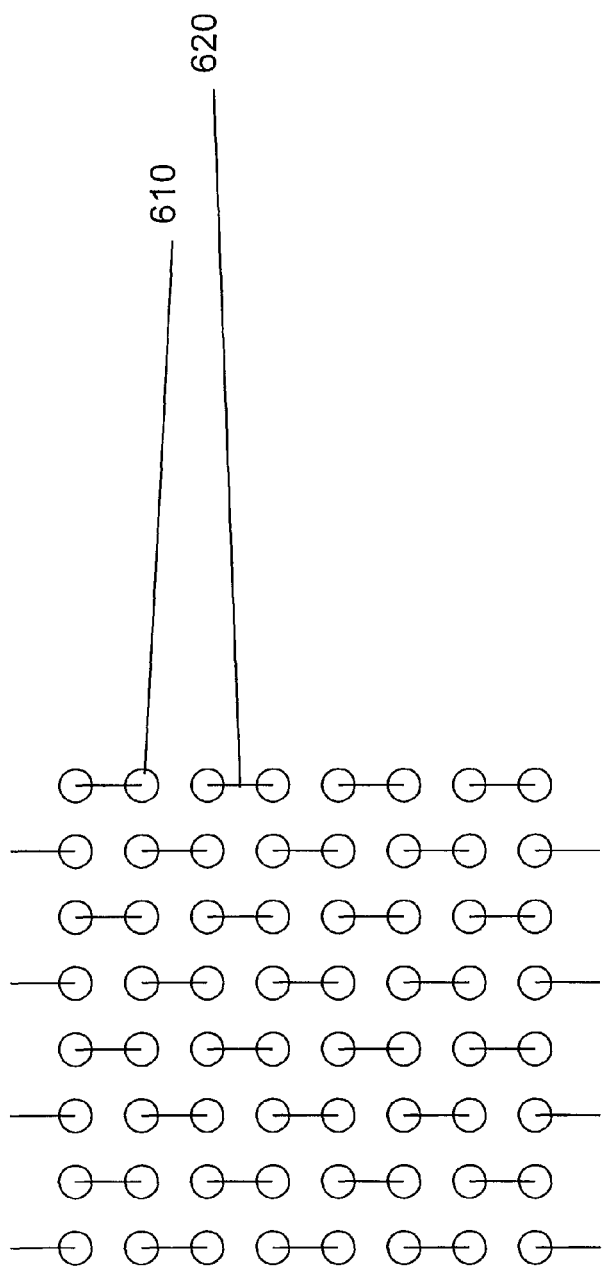
FIG. 6 sets forth a traditional pin assignment implementation in which a 27 dB of isolation is realized for a 100% signal pin configuration.

In FIG. 5, using various embodiments herein, a 32 dB of isolation utilizing 100% signal pins is set forth in which a substantially diagonal pin assignment of signal pins (500) is set forth from an optimized pattern determined by various embodiments herein in which signal pins (e.g., 510) may be paired in accordance with the optimized pattern. From FIG. 5, signal pins may be cross-paired (at 520) as it has been determined from the various embodiments herein that signal pins located proximate to an imaginary line perpendicular to a first determined signal pair have at least near perfect isolation. Further, from FIG. 5, a differential signal pair is shown where two signal pins may be connected in accordance with the determined optimized pattern at 530. Comparatively, from FIG. 6, only a 27 dB of isolation utilizing 100% signal pins is obtained using a traditional vertical approach. In FIG. 6, an arrangement using a traditional vertical pairing is set forth (600) in which signal pins (e.g., 610) are traditionally paired at 620.

The various embodiments of the present invention provide for optimized patterns and pin arrangements in which pins adjacent to signal pins provide for improved isolation thereby optimizing the signal utilization for a given isolation requirement and reducing crosstalk for high speed differential signals, whereas contradistinctively, in a the traditional approach, the adjacent pins typically provided for the lowest amount of isolation.

It will be understood by those skilled in the art that a Ball Grid Array (BGA) is a surface mount chip package that typically uses a grid of solder balls as its connectors, in which BGA chips may be often easier to align to a printed circuit board (PCB) as the leads, which may be underneath the chip, and/or may be farther apart than similar leaded packages. It will be further appreciated by those skilled in the art that BGA is a preferred design choice in chip scale packaging (CSP) in which a chip package is often sought to be not more than 1.2× the size of the semiconductor die itself. It will be further understood that an ASIC may include but is not limited to a BGA.

As used herein the term "footprint" is intended to mean and be interchangeably used with other terms including but not limited to available area, ASIC footprint, die, package, and die package size, etc.

As used herein the term "pattern" is intended to mean and be interchangeably used with other terms including but not limited to layout, ASIC layout, arrangement, pin and layout patterns, etc.

As used herein the term "substantially diagonally" is intended to mean non-vertical and non-horizontal.

The various present embodiments provide significant benefits to the field including those of ASIC designers who may now be able to provide for more differential signals pins per ASIC package using various embodiments herein, thereby also requiring fewer ASICs per design and significantly lowering the cost of systems employing the embodiments herein. Further, the various present embodiments provide for improved density of utilizable signals, full optimized patterns created using primitive cells, and higher electronic content from high yield dies which have lower costs.

While there are many structural and functional equivalents to the elements of the present embodiment, it is understood that those equivalents, technological improvements and functional equivalents, alone or in combination, are intended to be included in the description herein without exception. The present embodiment may be performed using software and/or in a computer system 705, in which the results are displayed, printed or otherwise provided for in electronic format.

Although the present embodiment has been described in accordance with the implementations shown, one of ordinary skill in the art will readily recognize that there could be variations to the implementations and those variations would be within the spirit and scope of the present embodiment. Accordingly, many modifications may be made by one of ordinary skill in the art without departing from the spirit and scope of the appended claims.

What is claimed is:

1. A computer based method to arrange signal pins for pairing in an integrated circuit, comprising:
   determining, in a computer system, an isolation requirement and an area for the integrated circuit;
   determining, in the computer system, a signal pin pattern that satisfies the isolation requirement within the area by repetitively performing operations, comprising:
   determining, in the computer system, available signal and ground pin pairs within the area for the integrated circuit;
   identifying, in the computer system, two diagonally adjacent signal pins;
   assigning, in the computer system, the two diagonally adjacent signal pins as a first diagonally adjacent signal pin pair;
   identifying, in the computer system, a diagonal reference line which extends perpendicularly from the first signal pin pair;
   identifying, in the computer system, a closest pair of signal pins which reside on the diagonal reference line; and
   adding, in the computer system, the closest pair of signal pins to the layout.

2. The computer based method of claim 1, further comprising determining, in the computer system, a maximal area of the integrated circuit.

3. The computer based method of claim 1, further comprising:
   identifying, in the computer system, signal pins proximate the first adjacent signal pin pair which do not lie on the diagonal reference line; and
   moving, in the computer system, the signal pins away from the first adjacent signal pin pair.

4. The computer based method of claim 3, further comprising:
   replacing, in the computer system, the signal pins moved away from the first adjacent with a ground pin or a power pin.

5. The computer based method of claim 4, further comprising generating, in the computer system, the layout pattern.

6. The computer based method of claim 5, wherein the layout pattern is generated in relation to a limitation with respect to the integrated circuit footprint.

7. The computer based method of claim 6, wherein the layout pattern is generated for an integrated circuit which is within a Ball Grid Array (BGA).

8. A computer based method to determine an integrated circuit signal pin layout by performing operations, comprising:
   (a) determining, in a computer system, available signal and ground pin pairs within the area for the integrated circuit;
   (b) identifying, in the computer system, two diagonally adjacent signal pins;
   (c) assigning, in the computer system, the two diagonally adjacent signal pins as a diagonally adjacent signal pin pair;
   (d) identifying, in the computer system, a diagonal reference line which extends perpendicularly from the diagonally adjacent signal pin pair;
   (e) identifying, in the computer system, a closest pair of signal pins which reside on the diagonal reference line;
   (f) adding, in the computer system, the closest pair of signal pins to the layout;
   (g) identifying, in the computer system, signal pins proximate the first diagonally adjacent signal pin pair which do not lie on the diagonal reference line; and (h) moving, in the computer system, the signal pins away from the first adjacent signal pin pair.

9. The computer based method of claim 1, further comprising:
   determining, in the computer system, an isolation requirement and a maximal area of the integrated circuit.

10. The computer based method of claim 9, further comprising:
    repeating, in the computer system, operations (a) through (f) until a signal pin layout is generated which satisfies the isolation requirement within the maximal area of the integrated circuit.

11. The computer based method of claim 10, further comprising generating, in the computer system, the layout pattern.

12. The computer based method of claim 11, wherein the layout pattern is generated for an ASIC which is within a Ball Grid Array (BGA).

13. A computer-based system to generate an integrated circuit signal pin layout by implementing operations, comprising:
    (a) determining, in the computer system, available signal and ground pin pairs within the area for the integrated circuit;
    (b) identifying, in the computer system, two diagonally adjacent signal pins;
    (c) assigning, in the computer system, the two diagonally adjacent signal pins as a diagonally adjacent signal pin pair;
    (d) identifying, in the computer system, a diagonal reference line which extends perpendicularly from the diagonally adjacent signal pin pair;
    (e) identifying, in the computer system, a closest pair of signal pins which reside on the diagonal reference line;
    (f) adding, in the computer system, the closest pair of signal pins to the layout;
    (g) identifying, in the computer system, signal pins proximate the first diagonally adjacent signal pin pair which do not lie on the diagonal reference line; and
    (h) moving, in the computer system, the signal pins away from the first adjacent signal pin pair.

14. The computer-based system of claim 13, further comprising:
    determining and isolation requirement and a maximal area of the integrated circuit.

15. The computer-based system of claim 13, wherein the computer system repeats operations (a) through (f) until a signal pin layout is generated which satisfies the isolation requirement within the maximal area of the integrated circuit.

16. The computer-based system of claim 14 wherein the computer system generates the layout pattern.

17. The computer-based system of claim 14, wherein the layout pattern is generated for an ASIC which is within a Ball Grid Array (BGA).

* * * * *